United States Patent [19]

Kile

[11] Patent Number: 5,366,381
[45] Date of Patent: Nov. 22, 1994

[54] ELECTRICAL CONNECTOR WITH ANTIROTATION FEATURE

[75] Inventor: Richard A. Kile, Harrisburg, Pa.

[73] Assignee: The Whitaker Corporation, Wilmington, Del.

[21] Appl. No.: 102,657

[22] Filed: Aug. 5, 1993

[51] Int. Cl.$^5$ .................................................. H05K 1/00
[52] U.S. Cl. ..................................... 439/79; 439/567; 439/751
[58] Field of Search ................. 439/751, 873, 741, 78, 439/79, 80, 567, 571, 82, 83

[56] References Cited

U.S. PATENT DOCUMENTS

| | | | |
|---|---|---|---|
| 4,150,863 | 8/1979 | Krafthefer | 339/17 LC |
| 4,436,358 | 3/1984 | Coldren et al. | 339/17 C |
| 4,533,203 | 8/1985 | Feldman et al. | 339/176 M |
| 4,550,962 | 11/1985 | Czeschka | 439/78 |
| 4,575,167 | 3/1986 | Minter | 339/17 L |
| 4,619,495 | 10/1986 | Sochor | 439/751 |
| 4,655,517 | 4/1987 | Bryce | 439/78 |
| 4,688,866 | 8/1987 | Legrady | 439/78 |
| 4,735,587 | 4/1988 | Kirayoglu | 439/751 |
| 4,743,205 | 5/1988 | Mitani et al. | 439/78 |
| 4,781,602 | 11/1988 | Cobaugh | 439/82 |
| 4,847,588 | 7/1989 | Doutrich | 439/751 |
| 4,907,978 | 3/1990 | Bowen | 439/79 |
| 4,908,335 | 3/1990 | Cosmos et al. | 439/79 |
| 5,073,119 | 12/1991 | Soes | 439/751 |
| 5,076,795 | 12/1991 | Krupp et al. | 439/79 |

*Primary Examiner*—David L. Pirlot
*Attorney, Agent, or Firm*—Gerald K. Kita

[57] ABSTRACT

An electrical connector comprises, an insulating body, electrically conductive posts projecting from the body and extending outwardly for insertion along apertures of a circuit board, each of said posts being one of three types, a first type having a protrusion adapted to engage a circuit board and prop the body to prevent the body from tipping over while the body is engaged against a circuit board, a second type having a retention feature tending to retain the body engaged against a circuit board, and a third type having neither said protrusion nor said retention feature.

9 Claims, 2 Drawing Sheets

5,366,381

ELECTRICAL CONNECTOR WITH ANTIROTATION FEATURE

FIELD OF THE INVENTION

The invention pertains to an electrical connector for mounting on a circuit board, and a feature of such a connector that resists movement of the connector relative to the circuit board.

BACKGROUND OF THE INVENTION

An electrical connector for mounting on a circuit board comprises, an insulative body and multiple conductive posts. Although a bottom of the body may engage flatly against the circuit board, vibration or some other disturbance experienced by the connector can cause the body to rotate and tip over to one side without pulling the posts out of the apertures. According to a desired manufacturing operation, the posts are fastened permanently to the circuit board by solder, the solder being applied by a soldering process. If the posts are secured by solder that is applied while the body is unknowingly in a tipped over position, the connector will be in an incorrect position when the solder fastens the posts permanently to the circuit board.

An electrical connector known from U.S. Pat. No. 5,122,075, comprises posts with retention features on the posts that engage on an underside of the circuit board and retain the body against the circuit board without the body rotating and tipping to one side.

In an electrical connector known as a right angle connector, the posts extend from a side of the body of the connector, and are bent along their lengths to extend toward a circuit board. The posts extend through respective apertures in a circuit board, and are soldered in place. The apertures are beside the body, instead of being directly under the body. Consequently, posts with retention features tend to pull the body to one side. Although a bottom of the body may engage flatly against the circuit board, the body will tend to rotate and tip over, at least partially, to one side, due to the posts tending to pull the body to one side. Again, if the posts are secured by solder that is applied while the body is unknowingly in a tipped over position, the connector will be in an incorrect position when the solder fastens the posts permanently to the circuit board.

An electrical connector known from U.S. Pat. No. 4,907,978, comprises, conductive pins adapted for insertion along respective apertures through a thickness of a circuit board, and the pins themselves comprise a clip adapted for drawing the connector into seated engagement with a circuit board. Because the pins are in apertures that are beside a body of the connector, the pins tend to pull the body to one side. A feature is not present to counteract a tendency for the body to rotate and tip over to one side.

SUMMARY OF THE INVENTION

A feature of the invention counteracts a tendency for an electrical connector to tip over toward one side while engaged against a circuit board.

According to an advantage of the invention, a body for an electrical connector is propped against tipping over while the connector engages against a circuit board.

A feature of the invention resides in a protrusion on a conductive post that engages a circuit board and props a body of an electrical connector to prevent the body from tipping over while the body is engaged against the circuit board.

DESCRIPTION OF THE DRAWINGS

The invention will now be described by way of example with reference to the accompanying drawings according to which.

DETAILED DESCRIPTION

Figure 1:
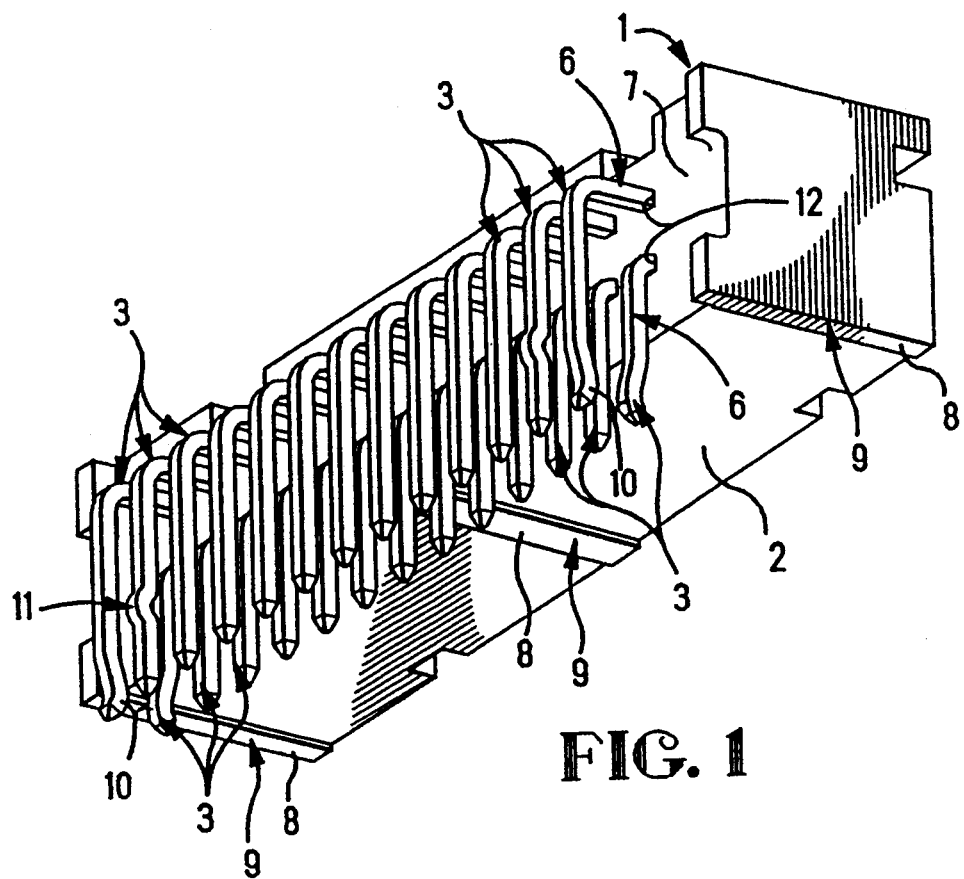
FIG. 1 is an isometric view of a connector comprising an insulative body and interchangeable posts.
Figure 2:
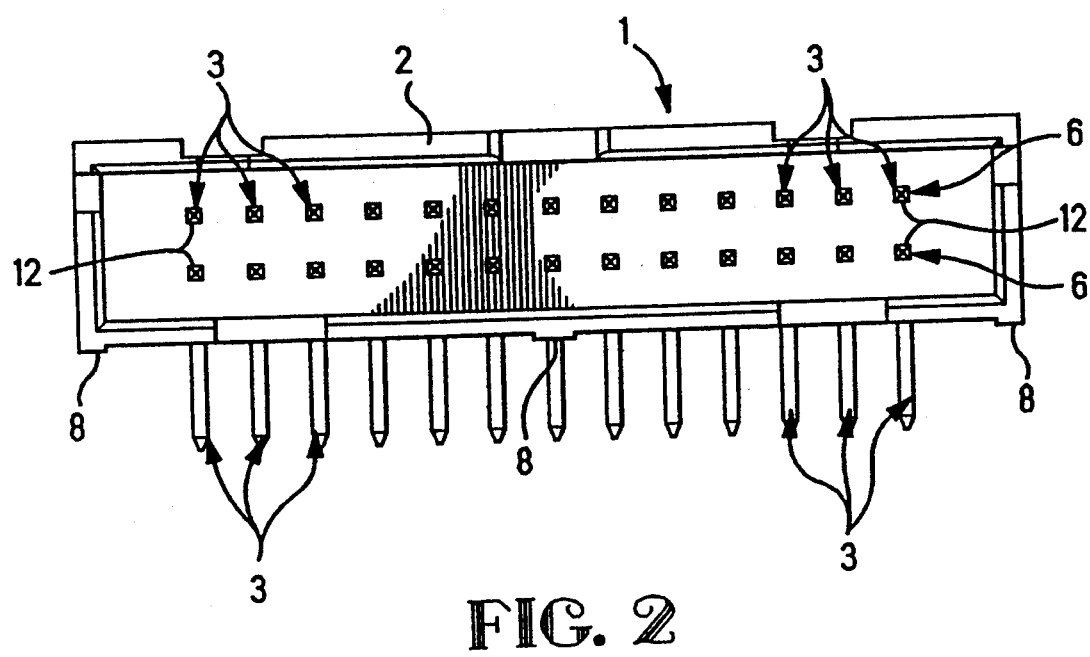
FIG. 2 is a front view of the connector shown in FIG. 1.
Figure 3:
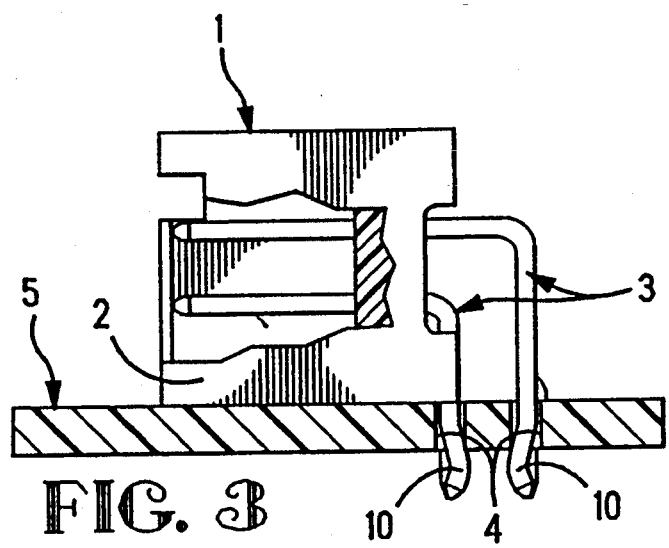
FIG. 3 is a side view with parts in section and with parts partially cut away of the connector shown in FIG. 1 with posts of a type having retention features.
Figure 4:
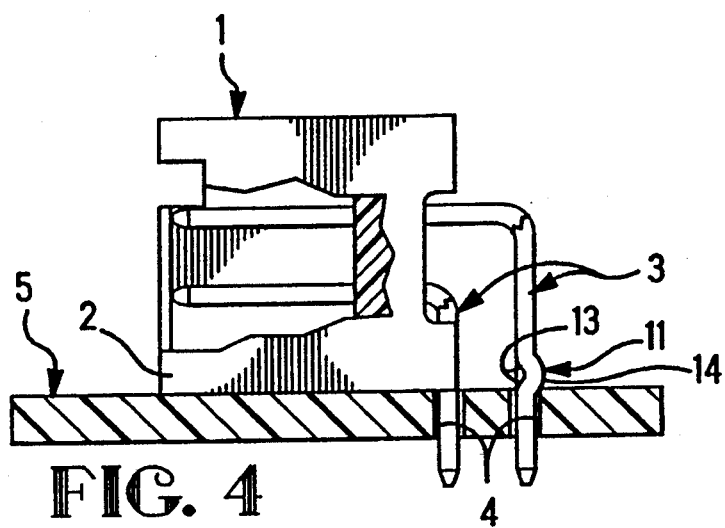
FIG. 4 is a view similar to FIG. 3 of the connector shown in FIG. 1 with at least one post of another type having a protrusion.
Figure 5:
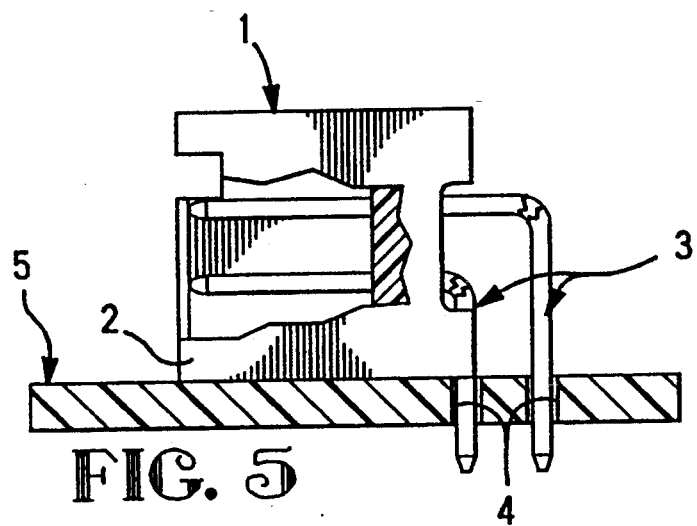
FIG. 5 is a view similar to FIG. 3 of the connector shown in FIG. 1 with posts of another type having neither retention features nor a protrusion.

With reference to FIG. 1, an electrical connector 1 comprises; an insulating body 2 combined with electrically conductive, interchangeable posts 3 projecting from the body 2 and extending outwardly for insertion along apertures 4, FIGS. 3 through 5, of a circuit board 5. The posts 3 are distributed in multiple rows 6 of posts 3, an outermost one of the rows 6 farthest from the body 2, and at least one inner row 6, between the outermost row 6 and the body 2. The posts 3 project from a side 7 of the body 2. The posts 3 are bent to extend beside the body 2 for insertion into the respective apertures 4 in the circuit board 5. The posts 3 are of sufficient lengths to extend beyond the level of the bottom 8 of the body 2 and into and along the respective apertures 4. The bottom 8 of the body 2 is the underside of the body 2 that engages the circuit board 5. In FIG. 1 the bottom 8 is defined on bottoms of projecting, spaced apart, stand off, feet 9 on the body 2 that elevate the body 2 from the circuit board 2.

With reference to FIGS. 3 through 5, each of the posts 3 is of a type selected from three types. Each post 3 of a first type is distinguished from the post 3 of a second type and a post 3 of a third type. The post 3 of a second type has a retention feature 10, FIG. 3, tending to retain the body 2 engaged against a circuit board 5, against which the bottom 8 engages. Further details of the posts 3 of the second type, and the retention feature 10, are disclosed in U.S. Pat. No. 5,122,075, in conjunction with an embodiment of a known connector. The post 3 of a third type has a protrusion 11, FIG. 4, adapted to engage the circuit board 5 while the body 2 of the connector 1 engages against the circuit board 5. The post 3 bridges between the body 2 and the circuit board 5, while the protrusion 11 engages the circuit board 5, and thereby the post 3 of the third type provides a prop for the body 2 to resist rotation of the body 2 and tipping over while the body 2 is engaged against the circuit board 5. Each of the posts 3 of the first type, FIG. 5, has neither the protrusion 10 nor the retention feature 9. Each embodiment disclosed herein is constructed with a post 3 selected from the post 3 of a second type that has a protrusion 11.

The body 2 of the connector is provided with post receiving cavities 12 in which the posts 3 fit interchangeably. The posts 3 are constructed so as to interfit interchangeably within any one of the cavities 12 that are constructed to be duplicates of one another. The cavities 12 are distributed in multiple rows of cavities, an outermost row receiving the outermost row 6 of the posts 3, and at least one inner row receiving an inner row 6 of the posts 3.

FIG. 1 can be interpreted so as to depict each of three embodiments as will now described. One embodiment resides in multiple posts 3 of the first type combined with at least one post 3 of the third type, together with a body 2 of a connector 1, as shown in FIG. 1. Another embodiment resides in multiple posts 3 of the second type combined with at least one post 3 of the third type, together with a body 2 of a connector 1, as shown in FIG. 1. Another embodiment resides in multiple posts 3 of the second type, and multiple posts 3 of the second type, combined with at least one post 3 of the third type, together with a body 2 of a connector 1, as shown in FIG. 1.

Any of the embodiments further can be modified with a construction of the posts 3 of the second type at the ends of the outermost row 6 of posts 3 and at the ends of an adjacent, inner row 6 of posts 3. This construction is achieved by inserting posts 3 of the second type in respective cavities 12 at both ends of the outermost row of cavities, and at both ends of an inner row of cavities that is adjacent to the outermost row of cavities. For example, any of the embodiments constructed with a post 3 of the second type can be constructed further with a post 3 of the third type adjacent to a post 3 of the second type in the same row 6 of posts 3. Any of the embodiments constructed with multiple posts 3 of the second type at both ends of the outer row 6 of posts 3 can be constructed with a post 3 of the third type adjacent to each of the posts 3 of the second type within the same row 6 of posts 3. The post 3 of the third type is located desirably in the outermost row 6 of posts 3 to provide a lengthy prop bridging between the body 2 and the circuit board 5 against which the body 2 engages, to resist rotation and tipping over of the body 2. Each of the posts 3 of the second type may be substituted for by a post 3 of the first type, thereby to construct an embodiment having multiple posts 3 of the first type combined with an least one post 3 of the third type.

A right angle type electrical connector 1 is constructed such that the posts 3 project from the one side 7 of the body 2, instead of projecting from the bottom 8 of the body 2. The posts 3 are bent along their lengths to extend toward the circuit board 5. The posts 3 extend through respective apertures 4 in the circuit board 5, and are soldered in place. The apertures 4 are beside the body 2, instead of being under the bottom 8 of the body 2. Although the bottom 8 of the body 2 may initially engage flatly against the circuit board 5, the body 2 without a post 3 of the third type will tend to rotate toward the apertures 4 and tip over, at least partially, to the one side 7. Especially if the body 2 is combined with posts 3 of the second type, the retention features 10 on such posts 3 tend to pull the body 2 to the one side 7.

It has been observed that vibration, or some other disturbance experienced by the connector 1, will cause the body 2 to tip over without pulling the posts 3 out of the apertures 4. According to a desired manufacturing operation, the posts 3 are fastened permanently to the circuit board 5 by solder, not shown, the solder being applied by a soldering process. If the posts 3 are secured by solder that is applied while the body 2 is unknowingly in a tipped over position, the connector 1 will be in an incorrect position when the solder fastens the posts 3 permanently to the circuit board 5. A post 3 of the third type provides a prop bridging between the body 2 and the circuit board 5 against which the body 2 engages, to resist rotation and tipping over of the body 2.

With reference to FIG. 4, the protrusion 11 is between the body 2 and a portion of the selected one of the posts 3 that is adapted for insertion along the aperture 4 of the circuit board 5. The protrusion 11 is at a level with the bottom 8 of the body 2 that is adapted to engage against the circuit board 5.

With reference to FIG. 4, the protrusion 11 is formed by inclined portions 13 on the selected one of the posts 3 converging to an apex 14, the apex 14 being positioned at a level with the bottom 8 of the body 2. The protrusion 11 is adapted to engage a corner intersection of the circuit board 5 and the aperture 4 in the circuit board 5, with the apex 14 above the surface of the circuit board 5, and with one of the inclined [portions 13 extending into the aperture 4 and engaged against the corner intersection.

Each retention feature 10 on a post 3 of the second type is located at a level below the level of the protrusion 11, such that the circuit board 5 is positioned between the levels of the protrusion 11 and the retention feature 10, and whereby, the body 2 of the electrical connector 1 is propped against tipping over while engaged against the circuit board 5.

A feature of the invention resides in a conductive pose 3 of an electrical connector 1 that has a protrusion 11 that engages a circuit board 5 against which the connector 1 engages, and the post 3 serves as a prop to resist rotation and tipping over of the connector 1.

I claim:

1. An electrical connector comprising: an insulating body, electrically conductive posts projecting from the body and extending outwardly for insertion along apertures of a circuit board, each of said posts being one of three types, a third type having a protrusion adapted to engage a circuit board and prop the body to prevent the body from tipping over while the body is engaged against a circuit board, a second type having a retention feature tending to retain the body engaged against a circuit board, and a first type having neither said protrusion nor said retention feature.

2. An electrical connector as recited in claim 1 wherein, the protrusion is between the body and a portion of a selected one of the posts that is adapted for insertion along an aperture of a circuit board.

3. An electrical connector as recited in claim 1 wherein, the bottom of the body is along feet on the connector that elevate a remainder of the connector from a circuit board, and the protrusion is at a level with the bottom.

4. An electrical connector as recited in claim 1 wherein, the posts are distributed in multiple rows, and the protrusion is on a selected one of the posts in an outermost one of the rows.

5. An electrical connector as recited in claim 1 wherein, the protrusion is formed by inclined portions on a selected one of the posts converging to an apex, the apex being positioned at a level with a bottom of the body for engaging a circuit board against which the bottom also engages.

6. An electrical connector as recited in claim 1 wherein, the protrusion is adjacent to a portion of a selected one of the posts for insertion along an aperture of a circuit board, and the protrusion is adapted to engage a corner intersection of a circuit board and an aperture of the circuit board.

7. An electrical connector as recited in claim 1 wherein, the posts are distributed in multiple rows, the protrusion is on a selected first of the posts in an outermost one of the rows, and the retention feature is on a selected second of the posts in the outermost row, and on a third post in another of the rows.

8. An electrical connector as recited in claim 7 wherein the second and third ones of the posts are adjacent to each other.

9. An electrical connector as recited in claim 7 wherein each said second and third ones of the posts is bent to comprise the retention feature.

* * * * *